United States Patent
Yang (10) Patent No.: US 11,024,344 B2
(45) Date of Patent: Jun. 1, 2021

(54) LANDING PAD IN INTERCONNECT AND MEMORY STACKS: STRUCTURE AND FORMATION OF THE SAME

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 16/155,447

(22) Filed: Oct. 9, 2018

(65) Prior Publication Data
US 2020/0111511 A1    Apr. 9, 2020

(51) Int. Cl.
| | | |
|---|---|---|
| *G11C 5/06* | (2006.01) | |
| *H01L 45/00* | (2006.01) | |
| *H01L 27/22* | (2006.01) | |
| *H01L 43/08* | (2006.01) | |
| *H01L 29/78* | (2006.01) | |
| *H01L 43/12* | (2006.01) | |

(52) U.S. Cl.
CPC .............. *G11C 5/06* (2013.01); *H01L 27/226* (2013.01); *H01L 29/78391* (2014.09); *H01L 43/08* (2013.01); *H01L 43/12* (2013.01); *H01L 45/1206* (2013.01); *H01L 45/16* (2013.01)

(58) Field of Classification Search
CPC ....................................................... H01L 21/44
USPC ......................................................... 438/597
See application file for complete search history.

(56) References Cited

U.S. PATENT DOCUMENTS

| | | | |
|---|---|---|---|
| 6,025,265 A | 2/2000 | Miller et al. | |
| 8,399,989 B2 | 3/2013 | Lin et al. | |
| 8,822,234 B2 | 9/2014 | Wang et al. | |
| 9,006,898 B2 | 4/2015 | Hampp et al. | |
| 9,614,144 B1 * | 4/2017 | Annunziata | ............. H01L 43/12 |
| 2007/0111144 A1 * | 5/2007 | Fujikawa | ............ H01L 29/4908 430/311 |
| 2007/0155150 A1 * | 7/2007 | Kim | ................... H01L 21/76831 438/597 |
| 2007/0264818 A1 | 11/2007 | Nakamura | |
| 2008/0284023 A1 | 11/2008 | Kim | |
| 2011/0003476 A1 * | 1/2011 | Yun | ....................... H01L 21/288 438/675 |
| 2012/0217559 A1 * | 8/2012 | Kim | ................... H01L 27/10855 257/296 |
| 2014/0355338 A1 * | 12/2014 | Perniola | ............. G11C 13/0004 365/163 |
| 2016/0284985 A1 * | 9/2016 | Shen | ....................... H01L 43/12 |

* cited by examiner

*Primary Examiner* — Sheng-Bai Zhu
(74) *Attorney, Agent, or Firm* — Scully, Scott, Murphy & Presser, P.C.; L. Jeffrey Kelly, Esq.

(57) ABSTRACT

A conductive landing pad structure is formed utilizing a selective deposition process on a surface of an electrically conductive structure that is embedded in a first dielectric material layer. The conductive landing pad structure is located on an entirety of a surface of the electrically conductive structure and does not extend onto the first dielectric material layer. A conductive metal-containing structure is formed on a physically exposed surface of the conductive landing pad structure. During the formation of the conductive metal-containing structure which includes ion beam etching and/or a wet chemical etch, no conductive landing pad material particles re-deposit on the sidewalls of the conductive metal-containing structure.

11 Claims, 5 Drawing Sheets

LANDING PAD IN INTERCONNECT AND MEMORY STACKS: STRUCTURE AND FORMATION OF THE SAME

BACKGROUND

The present application relates to a semiconductor structure and a method of forming the same. More particularly, the present application relates to a semiconductor structure including a conductive metal-containing structure that is located on a physically exposed surface of a conductive landing pad structure and is devoid of any re-deposited conductive landing pad material particles on the sidewalls thereof.

In interconnect device processing or memory device processing, a conductive landing pad and a conductive metal-containing material are formed as blanket layers on a dielectric material that includes an electrically conductive structure. The blanket layers of the conductive landing pad and the conductive metal-containing material are then patterned utilizing an ion beam and/or chemical wet etching process. During the etching process, conductive landing pad material is re-deposited as conductive landing pad material particles on the sidewalls of the patterned conductive metal-containing material. The presence of the conductive landing pad material particles degrades the yield of the resultant structure and can lead to unwanted shorts.

There is thus a need for providing a semiconductor structure in which no re-deposition of the conductive landing pad material occurs during the patterning of a blanket layer of a conductive metal-containing material.

SUMMARY

A conductive landing pad structure is formed utilizing a selective deposition process on a surface of an electrically conductive structure that is embedded in a first dielectric material layer. The conductive landing pad structure is located on an entirety of a surface of the electrically conductive structure and does not extend onto the first dielectric material layer. A conductive metal-containing structure is formed on a physically exposed surface of the conductive landing pad structure. During the formation of the conductive metal-containing structure which includes ion beam etching and/or a wet chemical etch, no conductive landing pad material particles re-deposit on the sidewalls of the conductive metal-containing structure. Thus, the resultant structure does not exhibit any shorts that are caused by the re-deposition of the conductive landing pad material on a sidewall of the conductive metal-containing structure. Also, yield degradation has been mitigated.

In one aspect of the present application, a method of forming a semiconductor structure is provided. In one embodiment, the method includes forming, by selective deposition, a conductive landing pad structure on a physically exposed surface of an electrically conductive structure that is embedded in a first dielectric material layer. A conductive metal-containing material is then formed on the conductive landing pad structure and a physically exposed portion of the first dielectric material layer. Next, the conductive metal-containing material is patterned to provide a conductive metal-containing structure, wherein during the patterning no conductive landing pad material particles re-deposit on sidewalls of the metal-containing conductive structure.

In another aspect of the present application, a semiconductor structure is provided. In one embodiment, the semiconductor structure includes an electrically conductive structure embedded in a first dielectric material layer. A conductive landing pad structure is located on an entirety of a surface of the electrically conductive structure, a conductive metal-containing structure is located on an entirety of a surface of the conductive landing pad structure, and a contact structure physically contacts at least one surface of the conductive metal-containing structure. In accordance with the present application, the conductive landing pad structure, the conductive metal-containing structure, and the contact structure are embedded in a second dielectric material layer that is present above the first dielectric material layer, and the conductive metal-containing structure has sidewalls that are devoid of re-deposited conductive landing pad material particles.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
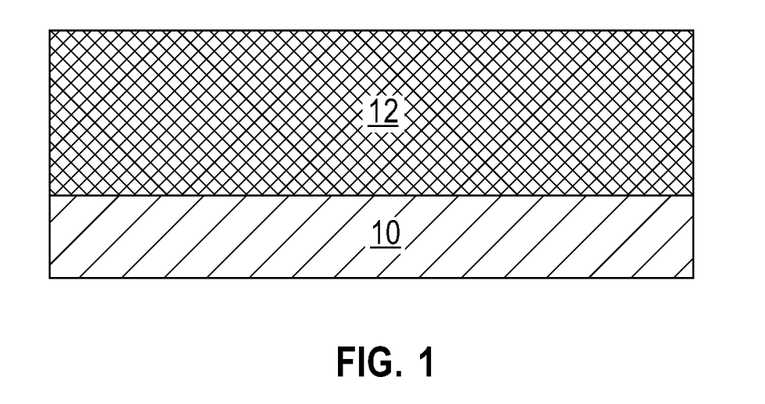
FIG. 1 is a cross sectional view of an exemplary semiconductor structure of the present application and during an early stage of fabrication, the structure including a first dielectric material layer located on a surface of a substrate.

Referring first to FIG. 1, there is illustrated an exemplary semiconductor structure of the present application and during an early stage of fabrication. The exemplary semiconductor structure shown in FIG. 1 includes a first interconnect dielectric material layer 12 located on a substrate 10.

In some embodiments, the substrate 10 may include a front-end-of-the-line (FEOL) level. The FEOL level includes a semiconductor substrate having one or more semiconductor devices such as, for example, transistors, capacitors, resistors, and etc. located thereon. In other embodiments, the substrate 10 may include one or more interconnect levels of a multilayered interconnect structure. In such an embodiment, each interconnect level would include one or more electrically conductive structures embedded in an interconnect dielectric material. A FEOL level is typically present beneath the lowest level of the multilayered interconnect structure.

The first dielectric material layer 12 may be composed of an inorganic dielectric material or an organic dielectric material. In some embodiments, the first dielectric material layer 12 may be porous. In other embodiments, the first dielectric material layer 12 may be non-porous. Examples of suitable dielectric materials that may be employed as the first dielectric material layer 12 include, but are limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

In some embodiments, the first dielectric material layer 12 may have a dielectric constant (all dielectric constants mentioned herein are measured relative to a vacuum, unless otherwise stated) that is about 4.0 or less. In one example, the first dielectric material layer 12 can have a dielectric constant of 2.8 or less. These dielectrics generally having a lower parasitic cross talk as compared to dielectric materials whose dielectric constant is greater than 4.0.

The first dielectric material layer 12 can be formed by a deposition process such as, for example, chemical vapor deposition (CVD), plasma enhanced chemical vapor deposition (PECVD) or spin-on coating. The first dielectric material layer 12 can have a thickness from 50 nm to 250 nm. Other thicknesses that are lesser than 50 nm, and greater than 250 nm can also be employed in the present application.

Figure 2:
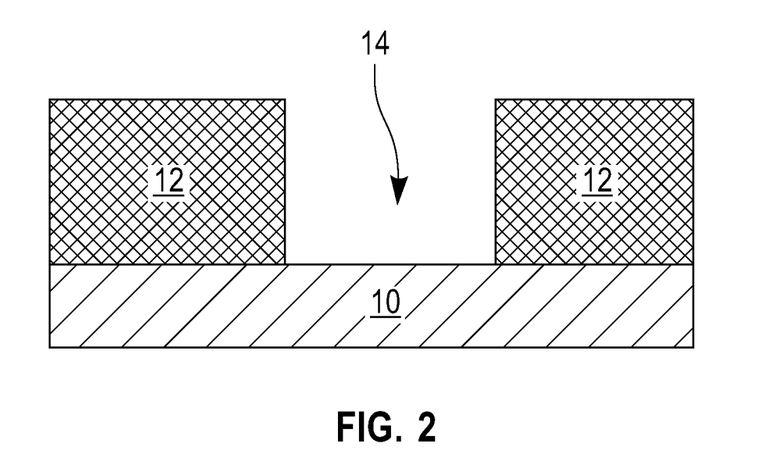
FIG. 2 is a cross sectional view of the exemplary semiconductor structure of FIG. 1 after forming an opening into the first dielectric material layer.

Referring now to FIG. 2, there is illustrated the exemplary semiconductor structure of FIG. 1 after forming an opening 14 into the first dielectric material layer 12. Although the present application describes and illustrates a single opening, the present application is not limited to only forming a single opening 14 into the first dielectric material layer 12. Instead, a plurality of openings can be formed into the first dielectric material layer 12.

In the present application, the opening 14 that is formed in the first dielectric material layer 12 may be a via opening, a line opening or a combined via/line opening. The opening 14 may be formed by lithography and etching. Lithography includes applying a photoresist material over a material or material stack to be patterned, exposing the photoresist material to a pattern of irradiation, and developing the exposed photoresist material. The etching may include an anisotropic etch etching process such as, for example, reactive ion etching. In embodiments in which a combined via/line opening is formed, a second iteration of lithography and etching may be used to form such an opening.

In some embodiments, and as is shown, the opening 14 extends through the entire depth of the first dielectric material layer 12. In other embodiments (not shown), the opening 14 may extend partially through the first dielectric material layer. In yet further embodiments (and also not shown), and when multiple openings are formed, each opening may have a same depth, or the openings may have different depths.

Figure 3:
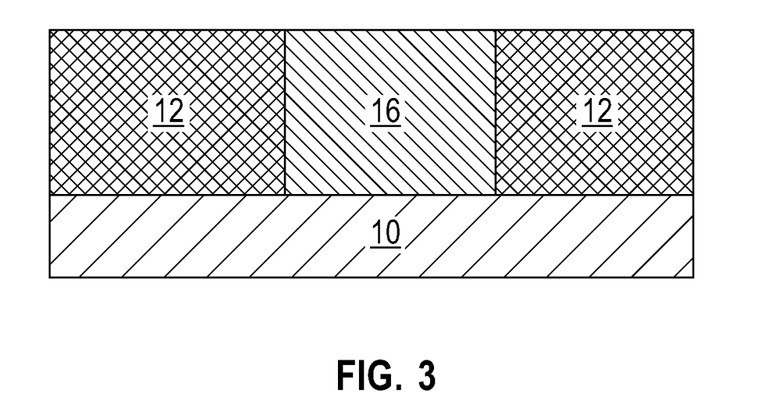
FIG. 3 is a cross sectional view of the exemplary semiconductor structure of FIG. 2 after forming an electrically conductive structure in the opening.

Referring now to FIG. 3, there is illustrated the exemplary semiconductor structure of FIG. 2 after forming an electrically conductive structure 16 in the opening 14. In some embodiments (not shown), a diffusion barrier liner can be also be present in the opening 14. In such an embodiment, the diffusion barrier liner separates the electrically conductive structure 16 from the first dielectric material layer 12.

In some embodiments and when a diffusion barrier liner is formed, a diffusion barrier material is first formed into the opening 14 and on an exposed topmost surface of the first dielectric material layer 12. The diffusion barrier material may include Ta, TaN, Ti, TiN, Ru, RuN, RuTa, RuTaN, W, WN or any other material that can serve as a barrier to prevent a conductive material from diffusing there through. The thickness of the diffusion barrier material may vary depending on the deposition process used as well as the material employed. In some embodiments, the diffusion barrier material may have a thickness from 2 nm to 50 nm; although other thicknesses for the diffusion barrier material are contemplated and can be employed in the present application as long as the diffusion barrier material does not entirely fill the opening 14. The diffusion barrier material can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed in the opening as well. The optional plating seed layer is employed to selectively promote subsequent electroplating of a pre-selected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional plating seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

An electrically conductive metal or metal alloy is formed into the opening 14; the electrically conductive metal or metal alloy provides the electrically conductive structure 16 of the present application. The electrically conductive metal or metal alloy may be composed of copper (Cu), aluminum (Al), tungsten (W), cobalt (Co), ruthenium (Ru), nickel (Ni), iridium (Ir), rhodium (Rh) or an alloy thereof such as, for example, a Cu—Al alloy. The electrically conductive metal or metal alloy can be formed utilizing a deposition process such as, for example, CVD, PECVD, sputtering, chemical solution deposition or plating. In one embodiment, a bottom-up plating process is employed in forming the electrically conductive metal or metal alloy. In some embodiments, the electrically conductive metal or metal alloy is formed above the topmost surface of the first dielectric material layer 12.

Following the deposition of the electrically conductive metal or metal alloy, a planarization process such as, for example, chemical mechanical polishing (CMP) and/or grinding, can be used to remove all portions of the electrically conductive metal or metal alloy (i.e., overburden material) that are present outside each of the openings forming the electrically conductive structure 16. The planarization stops on a topmost surface of the first dielectric material layer 12. If present, the planarization process also removes the diffusion barrier material from the topmost surface of the first dielectric material layer 12. The remaining portion of the diffusion barrier material that is present in the opening 14 is referred to herein as a diffusion barrier liner, while the remaining electrically conductive metal or metal alloy that is present in the opening 14 may be referred to as the electrically conductive structure 16. Collectively, the first dielectric material layer 12, if present, the diffusion barrier liner, and the electrically conductive structure 16 define a first level of the semiconductor structure of the present application. This first level may be an interconnect level or a middle-of-the-line (MOL) level.

Figure 4:
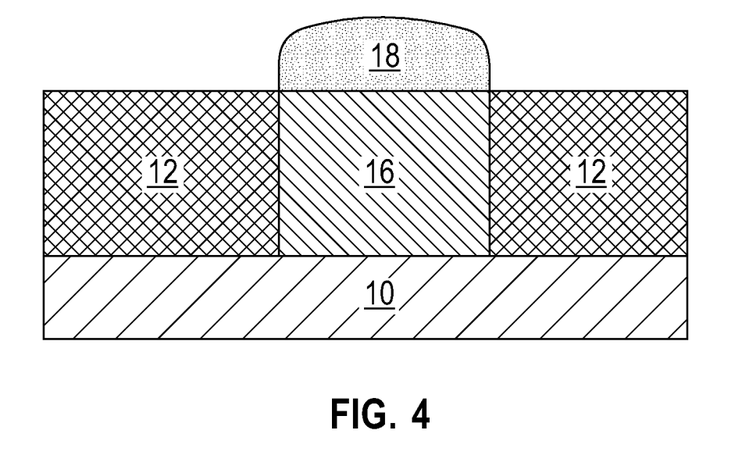
FIG. 4 is a cross sectional view of the exemplary semiconductor structure of FIG. 3 after forming, by selective deposition, a conductive landing pad on a physically exposed surface of the electrically conductive structure.

Referring now to FIG. 4, there is illustrated the exemplary semiconductor structure of FIG. 3 after forming, by selective deposition, a conductive landing pad 18 on a physically exposed surface of the electrically conductive structure 16. The conductive landing pad 18 does not extend onto the topmost surface of the first dielectric material layer 12. Instead, the conductive landing pad 18 is located on an entirety of the physically exposed surface of the electrically conductive structure 16; a portion of the conductive landing pad 18 may extend onto any diffusion barrier liner that is present in the opening 14. As is illustrated in FIG. 4, the conductive landing pad 18 that is formed has a concave surface that is opposite a surface that forms an interface with the physically exposed surface of the electrically conductive structure 16.

The conductive landing pad 18 can be composed of cobalt (Co), ruthenium (Ru), tantalum (Ta), tungsten (W), titanium (Ti), rhodium (Rh), platinum (Pt), nickel (Ni) or any alloy or multilayered stack thereof. The conductive landing pad 18 can have a thickness from 2 nm to 25 nm; other thicknesses are possible and can be used in the present application as the thickness of the conductive landing pad 18. The conductive landing pad 18 is formed utilizing a selective deposition such as, for example, CVD, PECVD, ALD or electroless deposition. The selective deposition of the conductive landing pad 18 may be performed at a deposition temperature that is less than 500° C.

Figure 5A:
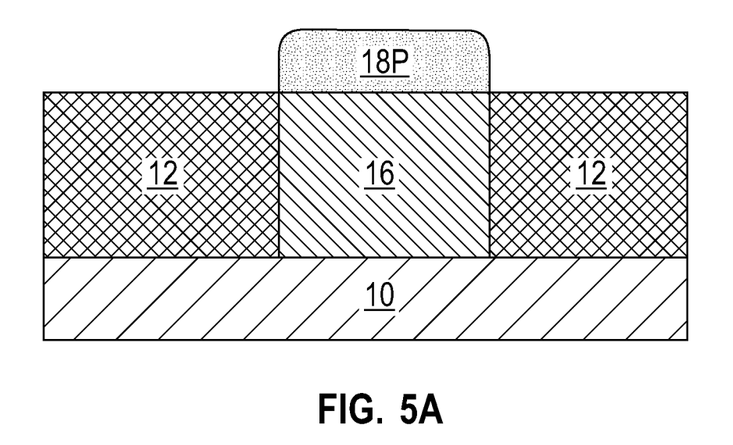
FIGS. 5A-5B are cross sectional views of the exemplary semiconductor structure of FIG. 4 after performing a planarization process.
Figure 5B:
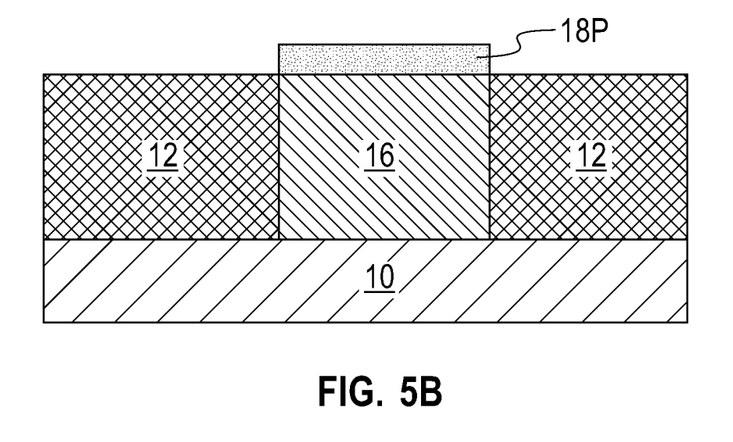

Referring now to FIGS. 5A-5B, there are illustrated the exemplary semiconductor structure of FIG. 4 after performing a planarization process such as, for example, chemical mechanical polishing (CMP). Notably, FIG. 5A illustrates the exemplary semiconductor structure of FIG. 4 after performing a planarization process in which only a relatively small amount (e.g., from 0.5 nm to 3 nm) of an upper portion of the conductive landing pad 18 is subjected to CMP, while FIG. 5B illustrates the exemplary semiconductor structure of FIG. 4 after performing a planarization process in which a greater amount (e.g., greater than 3 nm) of the upper portion of the conductive landing pad 18 is subjected to CMP. In either embodiment, a planarized topmost surface is provided. In FIGS. 5A-5B, element 18P denotes a conductive landing pad structure that is formed after the planarization process. In some embodiments, the planarization step may be entirely omitted. In such an embodiment, the conductive landing pad 18 having the concave upper surface may be used as the conductive landing pad structure.

The conductive landing pad structure 18P illustrated in FIG. 5A has a curved surface that connects the planar topmost surface of the conductive landing pad structure 18P to vertical sidewalls of the conductive landing pad structure 18P. The conductive landing pad structure 18P illustrated in FIG. 5B lacks such a curved surface and, instead, the planar topmost surface of the conductive landing pad structure 18P of FIG. 5B forms a right angle with each vertical sidewalls of the conductive landing pad structure 18P.

Figure 6:
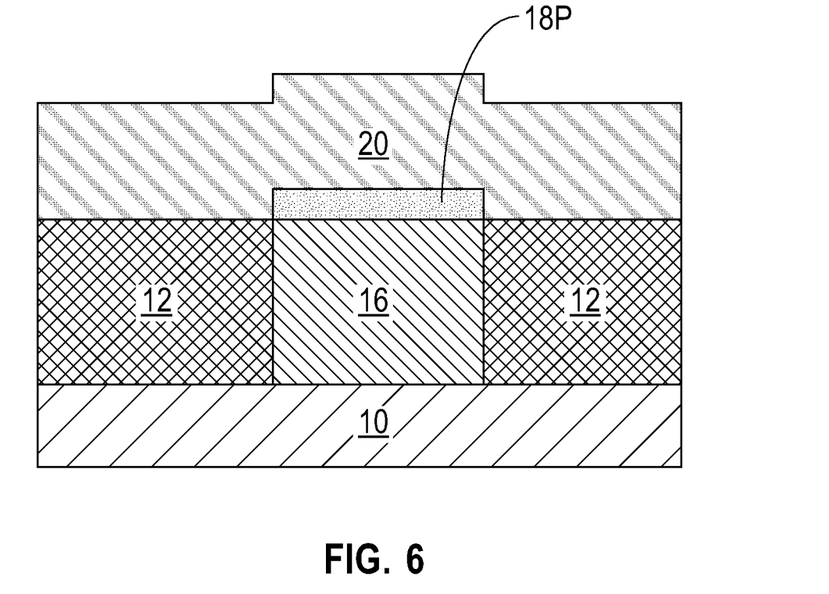
FIG. 6 is a cross sectional view of the exemplary semiconductor structure of FIG. 5B after forming a conductive metal-containing material.

Referring now to FIG. 6, there is illustrated the exemplary semiconductor structure of FIG. 5B after forming conductive metal-containing material 20. As is shown, the conductive metal-containing material 20 is a blanket layer that is formed on physically exposed surfaces of the first dielectric material layer 12 and physically exposed surfaces of the conductive landing pad structure 18P. Although the structure shown in FIG. 5B is described and illustrated as being used, the present application contemplates embodiments in which the conductive metal-containing material 20 is formed upon the structure shown in FIG. 4 or the structure shown in FIG. 5A.

In some embodiments, the conductive metal-containing material 20 is composed of an electrically conductive metal or a metal alloy, as defined above in providing the electrically conductive structure 16. In such an embodiment, the electrically conductive metal or metal alloy that provides conductive metal-containing material 20 may be the same as, or different from, the electrically conductive metal or metal alloy that provides the electrically conductive structure 14. The electrically conductive metal or metal alloy that provides the conductive metal-containing material 20 may be formed utilizing one of the deposition processes used to provide the electrically conductive metal or metal alloy layer that provides the electrically conductive structure 16.

In other embodiments, the conductive metal-containing material 20 is composed of a electrically conductive metal-containing material stack which may be used as a non-volatile memory device such as, for example, a ferroelectric memory (FE) device, a resistive random access memory (ReRAM) device, a magnetoresistive random access memory (MRAM) device, or a phase change random access memory (PRAM) device.

A FE memory device is a random access memory similar in construction to a DRAM by using a ferroelectric layer instead of a dielectric layer to achieved non-volatility. FE memory devices typically include a material stack of, from bottom to top, a bottom electrode, a ferroelectric layer, and a top electrode. The bottom and top electrodes may be composed of a metal or metal nitride. For example, TiN may be used as the material for both the bottom and top electrodes. The ferroelectric layer is composed of one or more ferroelectric materials exhibiting ferroelectricity (i.e., a material that has a spontaneous electric polarization that can be reversed by the application of an external electric field). Examples of ferroelectric materials that can be used as the ferroelectric layer include, but at not limited to, mixed metal oxides such as, $BaTiO_3$, $Pb(Zr_xTi_{1-x})O_3$ ($0.1 \leq x \leq 1$), or crystalline $HfO_2$ with, or without, a doping element selected from Zr, Al, Ca, Ce, Dy, Er, Gd, Ge, La, Sc, Si, Sr, Sn, C, N, and Y. The FE material stack can be formed by deposition of the various material layers.

A ReRAM device is a random access memory that typically includes a material stack of, from bottom to top, a bottom electrode, a metal oxide that can exhibit a change in electron localization, and a top electrode. The bottom and top electrodes may be composed of a metal or metal nitride. For example, TiN may be used as the material for both the bottom and top electrodes. The metal oxide may include oxides of nickel, zirconium, hafnium, iron, or copper. The ReRAM material stack can be formed by deposition of the various material layers.

A MRAM device is a random access memory, that includes a magnetic tunnel junction (MTJ) structure The magnetic tunnel junction (MTJ) structure may include a magnetic reference layer, a tunnel barrier, and a magnetic free layer. The magnetic reference layer has a fixed magnetization. The magnetic reference layer may be composed of a metal or metal alloy that includes one or more metals exhibiting high spin polarization. In alternative embodiments, exemplary metals for the formation of the magnetic reference layer include iron, nickel, cobalt, chromium, boron, and manganese. Exemplary metal alloys may include the metals exemplified by the above. In another embodiment, the magnetic reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier of the MTJ structure is composed of an insulator material and is formed at such a thickness as to provide an appropriate tunneling resistance. Exemplary materials for the tunnel barrier include magnesium oxide, aluminum oxide, and titanium oxide, or materials of higher electrical tunnel conductance, such as semiconductors or low-bandgap insulators.

The magnetic free layer of the MTJ structure is composed of at least one magnetic material with a magnetization that can be changed in orientation relative to the magnetization orientation of the reference layer. Exemplary materials for the free layer of the MTJ structure include alloys and/or multilayers of cobalt, iron, alloys of cobalt-iron, nickel, alloys of nickel-iron, and alloys of cobalt-iron-boron. The MTJ structure of the MRAM device can be formed by deposition of the various material layers.

A PRAM device is a random access memory that typically includes a material stack of, from bottom to top, a bottom electrode, a phase change memory material that exhibits a change in atomic order (from crystalline to amorphous or vice versa), and a top electrode. The bottom and top electrodes may be composed of a metal or metal nitride. For example, TiN may be used as the material for both the bottom and top electrodes. The phase change memory material may include a chalcogenide glass such as, for example, $Ge_2Sb_2Te_5$ or $Ge_2Bi_2Te_6$. The PRAM stack can be formed by deposition of the various material layers.

Figure 7:
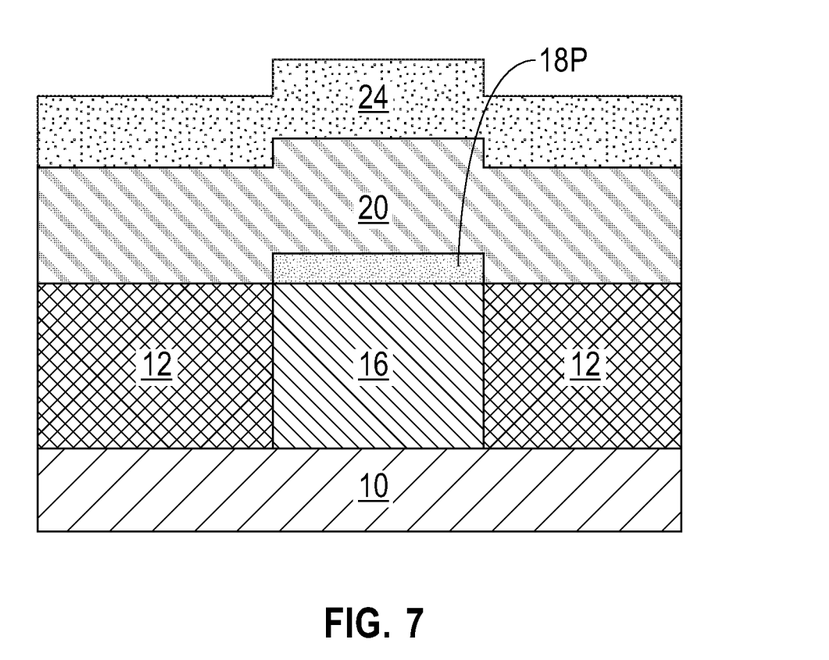
FIG. 7 is a cross sectional view of the exemplary semiconductor structure of FIG. 6 after forming a metal hard mask on the conductive metal-containing material.

Referring now to FIG. 7, there is illustrated of the exemplary semiconductor structure of FIG. 6 after forming a metal hard mask 24 on the conductive metal-containing material 20. In some embodiments, not shown, a planarization process may follow the formation of the metal hard mask 24.

The metal hard mask 24 may be composed of any metal-containing hard mask material such as, for example, titanium nitride or tantalum nitride. The metal hard mask 24 may be formed utilizing a deposition process such as, for example, CVD, PECVD, ALD, physical vapor deposition (PVD) or sputtering. The metal hard mask 24 may have a thickness from 20 nm to 150 nm; although other thicknesses can also be used as the thickness of the metal hard mask 24.

Figure 8:
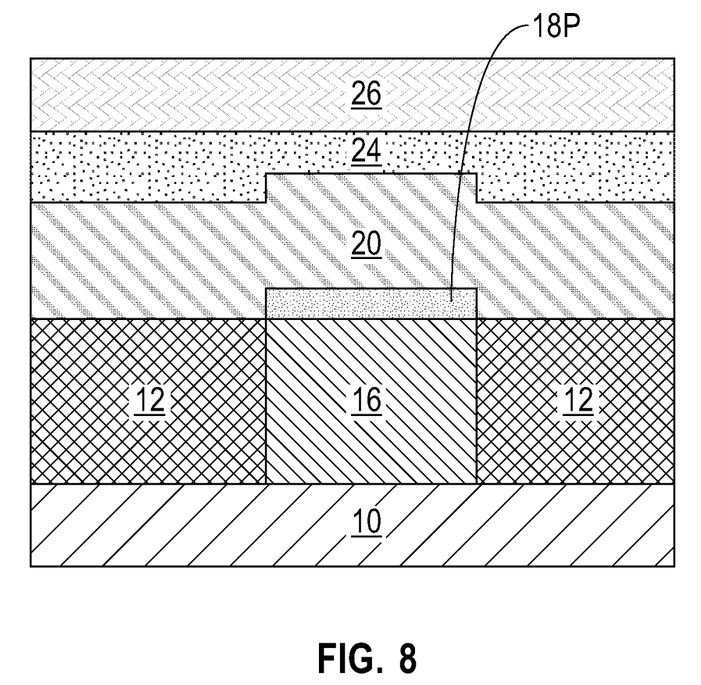
FIG. 8 is a cross sectional view of the exemplary semiconductor structure of FIG. 7 after forming a dielectric hard mask on the metal hard mask.

Referring now to FIG. 8, there is illustrated the exemplary semiconductor structure of FIG. 7 after forming a dielectric hard mask 26 on the metal hard mask 24. The dielectric hard mask 26 may be composed of any dielectric-containing hard mask material such as, for example, silicon dioxide or silicon nitride. The dielectric hard mask 26 may be formed utilizing a deposition process such as, for example, CVD, PECVD, ALD or PVD. The dielectric hard mask 26 may have a thickness from 25 nm to 200 nm; although other thicknesses can also be used as the thickness of the dielectric hard mask 26.

Figure 9:
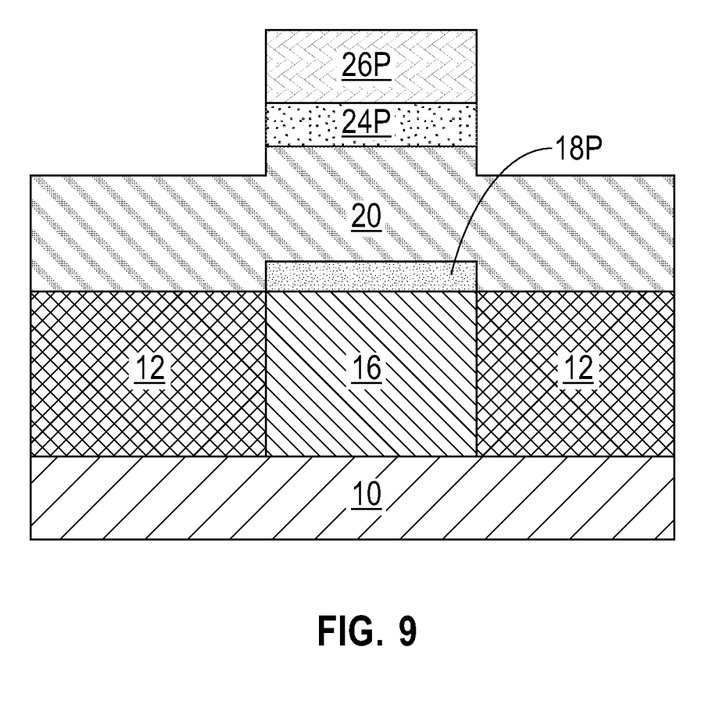
FIG. 9 is a cross sectional view of the exemplary semiconductor structure of FIG. 8 after patterning the dielectric hard mask and the metal hard mask.

Referring now to FIG. 9, there is illustrated the exemplary semiconductor structure of FIG. 8 after patterning the dielectric hard mask 26 and the metal hard mask 24. The patterning of the dielectric hard mask 26 and the metal hard mask 24 can be achieved by lithography, as defined above, and etching. The etching may include an anisotropic etch etching process such as, for example, reactive ion etching. The etching transfers a pattern provided by the patterned photoresist into the hard mask stack of the dielectric hard mask 26 and the metal hard mask 24. The dielectric hard mask 26 that remains after this patterning step may be referred to herein as a patterned dielectric hard mask 26P, while the metal hark mask 24 that remains after this patterning step may be referred to herein as a patterned metal hard mask 24P. The etch stops on a surface of the conductive metal-containing material 20. The patterned photoresist can be removed after this patterning step utilizing a resist removal process such as, for example, stripping or ashing.

The patterned dielectric hard mask 26P and the patterned metal hard mask 24P are located over the conductive landing pad structure 18P and have sidewalls that vertically aligned to each other as well as being vertically aligned to the underlying conductive landing pad structure 18P that is sits on the electrically conductive structure 16.

Figure 10:
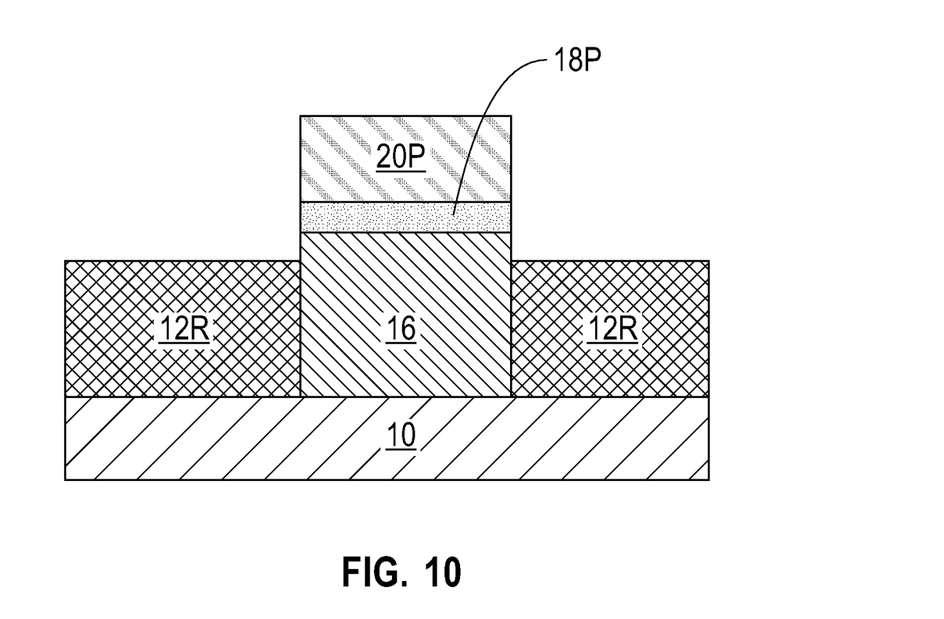
FIG. 10 is a cross sectional view of the exemplary semiconductor structure of FIG. 9 after patterning the conductive metal-containing material to provide a conductive metal-containing structure utilizing the patterned dielectric hard mask and the patterned metal hard mask as a combined etch mask, and removing the patterned dielectric hard mask and the patterned metal hard mask.

Referring now to FIG. 10, there is illustrated the exemplary semiconductor structure of FIG. 9 after patterning the conductive metal-containing material 20 to provide a conductive metal-containing structure 20P utilizing the patterned dielectric hard mask 26P and the patterned metal hard mask 24P as a combined etch mask, and removing the patterned dielectric hard mask 26P and the patterned metal hard mask 24P. In some embodiments, the conductive metal-containing structure 20P is another electrically conductive structure. In other embodiments, the conductive metal-containing structure 20P is a memory stack of a memory device as defined above.

During the patterning of the conductive metal-containing material 20, the physically exposed portions of the first dielectric material layer 12 may be recessed as shown in FIG. 10. The recessed first dielectric material layer is designated as element 12R in the drawings of the present application. The recessed first dielectric material layer 12R has a topmost surface that is located beneath a topmost surface of the electrically conductive structure 16. As such, an upper portion of the sidewalls of the electrically conductive structure 16 is now physically exposed.

The patterning of the conductive metal-containing material 20 includes an anisotropic etching process such as, for example, ion beam etching, chemical wet etching or a combination of ion beam etching and chemical wet etching. The etch removes portions of the conductive metal-containing material 20 that are not located under the patterned dielectric hard mask 26P and the patterned metal hard mask 24P. The remaining, i.e., non-etched, portion of the conductive metal-containing material 20 that is located under the patterned dielectric hard mask 26P and the patterned metal hard mask 24P constitutes the conductive metal-containing structure 20P.

Since this etch does not remove any portion of the conductive landing pad structure 18P, no re-deposition of the conductive landing pad material (as conductive landing pad material particles) occurs on the sidewalls of the resultant conductive metal-containing structure 20P. As such the resultant structure does not exhibit any shorts that are caused by the re-deposition of the conductive landing pad material on a sidewall of the conductive metal-containing structure.

The conductive metal-containing structure 20P has sidewalls that are vertically aligned to the sidewalls of the conductive landing pad structure 18P. In some embodiments, the sidewalls of the conductive metal-containing structure 20 are also vertically aligned to the sidewalls of the electrically conductive structure 16.

After patterning of the conductive metal-containing material 20, the patterned dielectric hard mask 26P and the patterned metal hard mask 24P can be removed utilizing one or more material removal processes. In one example, the patterned dielectric hard mask 26P and the patterned metal hard mask 24P can be removed utilizing a planarization process such as, for example, chemical mechanical polishing and/or grinding.

Figure 11:
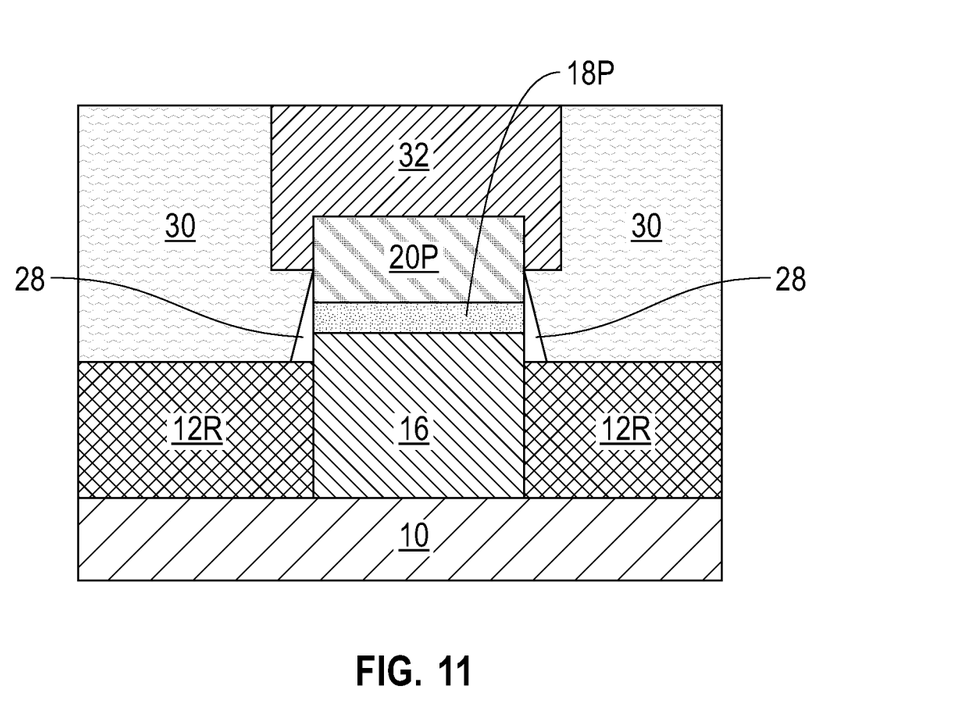
FIG. 11 is a cross sectional view of the exemplary semiconductor structure of FIG. 10 after forming an optional spacer, a second dielectric material layer, and a contact structure.

Referring now to FIG. 11, there is illustrated the exemplary semiconductor structure of FIG. 10 after forming an optional spacer 28, a second dielectric material layer 30, and a contact structure 32. The second dielectric material layer 30 defines an upper level of the structure of the present application.

When present, the spacer 28 is composed of a dielectric spacer material such as, for example, silicon dioxide, silicon nitride or a low-k material having a dielectric constant of less than the 4.0. The spacer 28 may be formed by deposition of the dielectric spacer material and thereafter subjecting the deposited dielectric spacer material to a spacer etch.

In some embodiments, and as shown, the spacer 28 has a base that is located on a physically exposed portion of the recessed first dielectric material layer 12R and has a sidewall that is present along the physically exposed upper portion of the sidewalls of the electrically conductive structure 16, the entirety of the sidewalls of the conductive landing pad structure 18P and a lower portion of the sidewalls of the conductive metal-containing structure 20P.

The second dielectric material layer 30 is formed laterally surrounding the entirety of the conductive landing pad structure 18P and an entirety of the conductive metal-containing structure 20P, and is present above a topmost surface of the conductive metal-containing structure 20P. In some embodiments and when the first dielectric material layer 12 is recessed, the second dielectric material layer 30 laterally surrounds an upper portion of the electrically conductive structure 16 as well. The second dielectric material layer 30 has a surface that directly contacts physically exposed portions of first dielectric material layer 12 or alternatively, the recessed first dielectric material layer 12R.

The second dielectric material layer 30 may include one of the dielectric materials mentioned above for the first dielectric material layer 12. In some embodiments, the second dielectric material layer 30 is composed of a same dielectric material as the first dielectric material layer 12. In other embodiments, the second dielectric material layer 30 is composed of a dielectric material that is compositionally different from the dielectric material that provides the first dielectric material layer 12. The second dielectric material layer 30 may be formed utilizing one of the deposition processes mentioned above in forming the first dielectric material layer 12. The second dielectric material layer 30 has a thickness that can be in the thickness range mentioned above for the first dielectric material layer 12.

Contact structure 32 is then formed into the second dielectric material layer 30. The contact structure 32 has at least one surface that contacts at least one surface of the conductive metal-containing structure 20P. In some embodiments, the contact structure 32 is in direct physical contact with a topmost surface of the conductive metal-containing structure 20P. In other embodiments, the contact structure 32 is in direct physical contact with an upper portion of the sidewalls of the conductive metal-containing structure 20P and a topmost surface of the conductive metal-containing structure 20P.

The contact structure 32 may be composed of one of the electrically conductive metals or metal alloys mentioned above for providing the electrically conductive structure 16. In one embodiment, the contact structure 32 is composed of a same electrically conductive metal or metal alloy as the electrically conductive structure 16. In other embodiment, the contact structure 32 is composed of an electrically conductive metal or metal alloy that is compositionally different from the electrically metal or metal alloy that provides the electrically conductive structure 16. The contact structure 32 can be formed by first providing a contact opening in the second dielectric material layer 30. The contact opening can be formed by lithography and etching. An optional diffusion barrier material, as defined above, can be formed into the contact opening prior to filling of the contact opening with an electrically conductive metal or metal alloy. The filling of the contact opening with the electrically conductive metal or metal alloy may include one of the deposition processes mentioned above for forming the electrically conductive metal or metal alloy that provides the electrically conductive structure 16. A planarization process may follow the filling of the contact opening with the electrically conductive metal or metal alloy. The contact structure 32 has a topmost surface that is coplanar with a topmost surface of the second dielectric material layer 30.

FIG. 11 illustrates an exemplary semiconductor structure of the present application. Notably, FIG. 11 illustrates a semiconductor structure that includes an electrically conductive structure 16 embedded in a first dielectric material layer 12 (or 12R). A conductive landing pad structure 18P is located on an entirety of a surface of the electrically conductive structure 16, a conductive metal-containing structure 20P is located on an entirety of a surface of the conductive landing pad structure 18P, and a contact structure 32 physically contacts at least one surface of the conductive metal-containing structure 20P. In accordance with the present application, the conductive landing pad structure 18P, the conductive metal-containing structure 20P, and the contact structure 32 are embedded in a second dielectric material layer 30 that is present above the first dielectric material layer 12 (or 12R), and the conductive metal-containing structure 20P has sidewalls that are devoid of re-deposited conductive landing pad material particles.

As is further illustrated, the sidewalls of the conductive metal-containing structure 20P are vertically aligned to the sidewalls of the conductive landing pad structure 18P. Also, and in the illustrated embodiment, the sidewalls of the conductive metal-containing structure 20P are vertically aligned to the sidewalls of the electrically conductive structure 16. In some embodiments, the exemplary structure shown in FIG. 11 is an interconnect structure. In other embodiments, the exemplary structure of FIG. 11 is a memory device.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
   selectively depositing a conductive landing pad structure directly on an entirety of a topmost surface of an electrically conductive structure that is embedded in a first dielectric material layer, wherein no portion of the conductive landing pad structure extends onto, and is in direct physical contact with, a topmost surface of the first dielectric material layer, and the conductive landing pad has a concave surface that is opposite a surface that forms an interface with the electrically conductive structure;
   forming a conductive metal-containing material on an entirety of the concave surface and an entirety of sidewalls of the conductive landing pad structure and a physically exposed portion of the first dielectric material layer; and
   patterning the conductive metal-containing material to provide a conductive metal-containing structure on the the conductive landing pad structure.

2. The method of claim 1, further comprising forming a second dielectric material layer above the first dielectric material layer, and laterally surrounding at least the conductive landing pad structure, and the conductive metal-containing structure.

3. The method of claim 2, further comprising forming a contact structure in the second dielectric material layer and contacting at least one surface of the conductive metal-containing structure.

4. The method of claim 2, further comprising forming a spacer on the sidewalls of the metal-containing conductive structure and sidewalls of the conductive landing pad structure prior to forming the second dielectric material layer.

5. The method of claim 1, wherein the conductive metal-containing material is composed of an electrically conductive metal or metal alloy.

6. The method of claim 1, wherein the conductive metal-containing material is composed of a non-volatile memory stack.

7. The method of claim 6, wherein the non-volatile memory stack includes a ferroelectric (FE) memory stack, a resistive random access memory (ReRAM) stack, a magnetoresistive random access memory (MRAM) stack, or a phase change random access memory (PRAM) stack.

8. The method of claim 1, wherein the patterning of the conductive metal-containing material comprises:
   forming an etch mask composed of a patterned metal hard mask and a patterned dielectric hard mask on the conductive metal-containing material, wherein the etch mask is located over the conductive landing pad structure; and
   removing physically exposed portions of the conductive metal-containing material by ion beam etching, chemical wet etching or a combination of ion beam etching and chemical wet etching.

9. The method of claim 8, wherein during the removing of the physically exposed portions of the conductive metal-containing material an upper portion of the first dielectric material layer is removed.

10. The method of claim 1, wherein during the patterning no conductive landing pad material particles re-deposit on sidewalls of the metal-containing conductive structure.

11. A method of forming a semiconductor structure, the method comprising:
    selectively depositing a conductive landing pad structure directly on an entirety of a topmost surface of an electrically conductive structure that is embedded in a first dielectric material layer, wherein no portion of the conductive landing pad structure extends onto, and is in direct physical contact with, a topmost surface of the first dielectric material layer, and the conductive landing pad has a concave surface that is opposite a surface that forms an interface with the electrically conductive structure;
    planarizing the conductive landing pad structure to remove the concave surface and provide the conductive landing pad structure with a planarized topmost surface;
    forming a conductive metal-containing material on an entirety of the planarized topmost surface and an entirety of sidewalls of the conductive landing pad structure and a physically exposed portion of the first dielectric material layer; and
    patterning the conductive metal-containing material to provide a conductive metal-containing structure on the conductive landing pad structure.

* * * * *